(12) United States Patent  (10) Patent No.: US 7,051,254 B2
Sugimoto  (45) Date of Patent:  May 23, 2006

(54) SEMICONDUCTOR INTEGRATED CIRCUIT DEVICE AND METHOD FOR DESIGNING A SEMICONDUCTOR INTEGRATED CIRCUIT DEVICE

(75) Inventor: Yuichiro Sugimoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 358 days.

(21) Appl. No.: 10/171,062

(22) Filed: Jun. 12, 2002

(65) Prior Publication Data

US 2002/0186585 A1  Dec. 12, 2002

(30) Foreign Application Priority Data

Jun. 12, 2001  (JP)  ............................. 2001-177436

(51) Int. Cl.
*G01R 31/28* (2006.01)
(52) U.S. Cl. ................. 714/726; 326/16; 365/201; 324/76.59; 702/117
(58) Field of Classification Search ................ 714/726, 714/724, 718, 738, 727, 733, 729; 716/14; 326/16, 38; 703/1; 702/117, 120; 365/201; 324/527, 76.59
See application file for complete search history.

(56) References Cited

U.S. PATENT DOCUMENTS

| | | | |
|---|---|---|---|
| 5,172,377 A | 12/1992 | Robinson et al. | |
| 5,404,359 A * | 4/1995 | Gillenwater et al. | 714/733 |
| 5,450,455 A | 9/1995 | Hamilton et al. | |
| 5,563,507 A | 10/1996 | Farwell | |
| 5,706,296 A * | 1/1998 | Whetsel | 714/726 |
| 5,774,474 A * | 6/1998 | Narayanan et al. | 714/726 |
| 5,812,561 A * | 9/1998 | Giles et al. | 714/726 |
| 6,374,380 B1 * | 4/2002 | Sim | 714/727 |
| 6,515,483 B1 * | 2/2003 | Porterfield | 324/529 |
| 6,725,406 B1 * | 4/2004 | Kakizawa et al. | 714/727 |

FOREIGN PATENT DOCUMENTS

| | | |
|---|---|---|
| JP | 60-147659 | 8/1985 |
| JP | 63-255672 | 10/1988 |
| JP | 3-105269 | 5/1991 |
| JP | 6-118140 A | 4/1994 |
| JP | 8-86836 | 4/1996 |
| JP | 2001-42008 | 2/2001 |

* cited by examiner

*Primary Examiner*—Albert Decady
*Assistant Examiner*—John P. Trimmings
(74) *Attorney, Agent, or Firm*—Hamre, Schumann, Mueller & Larson, P.C.

(57) ABSTRACT

A semiconductor integrated device provided with a non-scan block being supplied with an input signal and supplying an output signal, and a selector, into which the input signal and the output signal of the non-scan block are input and which selects one of these signals as an externally output signal and outputs it. The selector is controlled such that it selects the input signal of the non-scan block when a scan test is performed and selects the output signal of the non-scan block when a scan test is not performed. Thus, during the scan test it is possible to control the input signal and observe the output signal of the scan block.

16 Claims, 11 Drawing Sheets

SEMICONDUCTOR INTEGRATED CIRCUIT DEVICE AND METHOD FOR DESIGNING A SEMICONDUCTOR INTEGRATED CIRCUIT DEVICE

BACKGROUND OF THE INVENTION

1. Field of the Invention

The present invention relates to semiconductor integrated circuit devices (hereinafter, referred to as LSIs), and in particular relates to LSIs incorporating a block suited for a non-scan test method (hereinafter, referred to as non-scan block) and a block suited for a scan test method (hereinafter, referred to as scan block) for fault diagnosis.

2. Description of Related Art

An LSI including non-scan blocks and scan blocks has scan flip-flops (hereinafter, referred to as scan FFs) inserted at the input/output pins of the scan blocks in order to increase the fault detection rate during scan testing. FIG. 7 is a block diagram showing an example of a scan block. A scan block 60 is made of an AND circuit 61, a scan FF 62, and a NOT circuit 65. The numeral 63 denotes an input signal, 64 an output signal, 66 a scan shift-in signal, and 67 a scan shift-out signal.

FIG. 8 is a schematic view of an LSI module that includes a non-scan block and a scan block and employs a scan test method for fault diagnosis. FIG. 8A shows an LSI module 80 of the simplest conceivable configuration, and FIG. 8B shows an LSI module 90 with a configuration actually used in the prior art. The numerals 81 and 93 denote non-scan blocks, 82 and 84 denote scan FFs, and 87 denotes a selector. Numerals 85, 91 and 94 denote input signals, 86, 92 and 95 denote output signals, 88 denotes a scan shift-in signal, and 89 denotes a scan shift-out signal.

When diagnosing faults by scan testing, the Q and the DT of the scan FF are connected like a shift register. Also, in this system, the value of the scan FF is freely set by a shift in operation, the D input signal of the scan FF is taken in by a capture operation, and the scan FF value is output outside the LSI module by a shift out operation.

The non-scan blocks 81 and 93 have been designed without consideration for scan testing. For that reason, during scan testing the input signals 91 and 94 are not input to the scan FF, for example, and thus the value of the input signals 91 and 94 cannot be output outside the LSI module. Moreover, during scan testing the output signals 92 and 95 are not output to the scan FF, for example, and thus the value of the output signals 92 and 95 cannot be set.

In the case of the AND circuit 61 shown in FIG. 7, faults are detected by scan testing as described below.

First, a case where a stuck-at-0 fault on the I1 input terminal, a stuck-at-0 fault on the I2 input terminal, and a stuck-at-0 fault on the O1 output terminal of the AND circuit 61 are detected will be described. In this case, "1" must be input to the I1 input terminal and the I2 input terminal and the value of the O1 output terminal must be observed. To input "1" to the I1 input terminal it is possible to shift-in "1" to the scan FF 62. Also, to observe the value of the O1 output terminal, the scan FF 62 can be used to capture and hold the value of the O1 output terminal and then perform a shift-out operation. However, whether a "1" can be input to the I2 input terminal depends on the source supplying the input signal 63. Accordingly, conventional configurations of LSI modules also including an input stage for the AND circuit 61 are investigated below.

In the case of the LSI module 80 in FIG. 8A, the output signal 92 of the non-scan block 81 is supplied as the input signal 63, and therefore "1" cannot be intentionally input to the I2 input terminal of FIG. 7. Thus, a stuck-at-0 fault on the I1 input terminal, a stuck-at-0 fault on the I2 input terminal, and a stuck-at-0 fault on the O1 output terminal of the AND circuit 61 cannot be detected.

Consequently, in the prior art it was necessary to adopt a configuration like that of the LSI module 90 in FIG. 8B. With the LSI module 90, a selector 87 and a scan FF 82 are provided on the supply side of the input signal 63 to make it possible to set any value as the input signal 63 during scan testing using the scan FF 82. Providing the selector 87 and the scan FF 82 makes it possible intentionally to input "1" for the I2 input terminal of the AND circuit 61. Therefore, it was possible to detect a stuck-at-0 fault on the I1 input terminal, a stuck-at-0 fault on the I2 input terminal, and a stuck-at-0 fault on the O1 output terminal of the AND circuit 61.

Similarly, a predetermined value must be intentionally input to the I2 input terminal to detect a stuck-at-1 fault on the I1 input terminal or a stuck-at-1 fault on the I2 input terminal of the AND circuit 61. For that reason, a configuration such as that of the LSI module 90 of FIG. 8B was necessary.

Next, a case where a stuck-at-1 fault on the O1 output signal of the AND circuit 61 is detected will be described. In this case, a "0" must be input to either the I1 input terminal or the I2 input terminal of the AND circuit 61 and the value of the O1 output terminal must be observed. To input "0" to the I1 input terminal, it is possible to shift-in "0" to the scan FF 62. Also, to observe the value of the O1 output terminal, the scan FF 62 can capture and hold the value of the O1 output terminal and then shift-out. Controlling the scan FF 62 in this way makes it possible to detect a stuck-at-1 fault on the O1 output signal of the AND circuit 61. Consequently, a stuck-at-1 fault on the O1 output signal of the AND circuit 61 can be detected independently of whether the source supplying the input signal 63 to the scan block 60 is a signal output from a non-scan block. This means that a stuck-at-1 fault on the O1 output signal of the AND circuit 61 can be detected with either the configuration of the LSI module 80 in FIG. 8A or that of the LSI module 90 of FIG. 8B.

Faults in the NOT circuit 65 are detected by scan testing as described next.

First, a case of detecting a stuck-at-0 fault on the I3 input terminal and the O2 output terminal of the NOT circuit 65 is described. In this case, a "1" must be input to the I3 input terminal and the value of the O2 output terminal must be observed. To input "1" to the I3 input terminal, a "1" can be shifted-in to the scan FF 62. However, whether the value of the O2 output terminal can be detected depends on the supply destination of the output signal 64. Accordingly, conventional configurations of LSI modules that also include an AND circuit 61 output stage are investigated below.

In the case of the LSI module 80 shown in FIG. 8A, it is not possible to observe the value of the O2 output terminal because the output signal 64 is supplied as the input signal 94 of the non-scan block 93. Thus, a stuck-at-0 fault on the I3 input terminal and the O2 output terminal of the NOT circuit 65 cannot be detected.

On the other hand, in the case of the LSI module 90 in FIG. 8B, a further scan FF 84 has been provided as the supply destination of the output signal 64. During the scan test, the scan FF 84 is used to capture and hold the value of the output signal 64 and then shift-out so that the value of the output signal 64 can be observed outside the LSI module 90.

By adopting this configuration it is possible to observe the value of the O2 output terminal and detect a stuck-at-0 fault on the I3 input terminal and the O2 output terminal of the NOT circuit 65.

Likewise, the value for the O2 output terminal also must be observed in the case of detecting a stuck-at-1 fault on the I3 input terminal and the O2 output terminal of the NOT circuit 65. Consequently, a configuration such as that of the LSI module 90 in FIG. 8B is necessary.

As explained above, the configuration of the LSI module 80 in FIG. 8A is the simplest conceivable LSI configuration, but it is not suited for scan blocks with a conventional configuration.

FIG. 9 is a collection of the conditions under which stuck-at faults on input and output terminals of the AND circuit 61 and the NOT circuit 65 of the scan block 60 can be detected. In the following explanation, the fault that is detectable when the input signal 63 can be controlled by the scan FF provided for the supply source is a fault A. The fault that is detectable when the output signal 64 can be observed with the scan FF provided for the supply source is a fault B. And a fault detectable by the scan FF 62 inside the scan block, regardless of whether the input signal 63 can be controlled by the scan FF provided for the supply source or the output signal 64 can be observed by the scan FF provided for the supply destination is expressed as a fault C.

Conventional technologies have employed a non-scan test for the analog circuit portion and a scan test for the digital circuit portion in a block including an analog circuit portion and a digital circuit portion for controlling the analog portion, such as an A/D converter (analog-digital converter). For the same reason as above, this case required the insertion of a scan FF into the path of the signal traveling between the analog circuit portion and the digital circuit portion.

FIG. 10 is a schematic view of such an A/D converter. An A/D converter 105 is made of a digital circuit portion 100, an analog circuit portion 101, scan FFs 106 and 107, and a selector 108. The numerals 102 and 103 denote input signals and 104 denotes an output signal. Like the block 60 shown in FIG. 7 that is adopted for a scan test method, there exists a fault A' that can be detected if the signal that is input from the analog circuit portion 101 to the digital circuit portion 100 can be controlled during scan testing, and a fault B' that can be detected if the signal that is output from the digital circuit portion 100 to the analog circuit portion 101 can be observed during scan testing. Faults A' and B' are detected by the scan FFs 106 and 107 and the selector 108 in the same way as described with reference to FIG. 8B.

FIG. 11 is a schematic view of a universal micro-controller LSI, which here serves as an example of an ordinary LSI. A mode control circuit 110, a ROM 111, a RAM 112, a serial I/F 113, and analog circuits 114a and 114b are the non-scan blocks. A CPU 115, a timer 116, an A/D conversion digital circuit 117, and a D/A conversion digital circuit 118 are the scan blocks. The numeral 119 denotes an input/output control circuit. Like the conventional example explained above, to increase the fault detection rate in the scan blocks during the scan test it is necessary to add a scan FF between the scan blocks and the non-scan blocks.

FIG. 12 illustrates how scan FFs and selectors for enabling scan testing are added to the universal microcontroller LSI of FIG. 11. The numerals 120 to 133 denote scan FFs and 200 to 206 denote selectors. The scan FFs 120 to 133 and the selectors 200 to 206 are inserted between scan blocks and non-scan blocks. In the case of the LSI in FIG. 12, scan FFs and selectors are inserted in seven locations.

The broken lines in FIG. 12 indicate signals that are output from the non-scan blocks. During scan testing, the value of these signals cannot be freely set. However, during scan testing, the selectors 201 to 206 switch to the output from the scan FFs 121, 123, 125, 126, 129, 131, and 133, which are capable of freely setting these values.

Also, the long-short dashed lines in FIG. 12 are signals that are input to the non-scan block. During scan testing, the value of these signals cannot be observed. However, the scan FFs 120, 122, 124, 127, 128, 130, and 132 can capture these values so that they can be observed during scan testing.

Next, the IP base design flow of the LSI will be described. FIG. 13 shows the scan circuit design flow in the IP base design of the LSI. S1 is a step for designing the scan FF block to be inserted between the non-scan block IP and the scan block IP. S2 is a step for connecting the IPs and the scan FF block. S3 is a step for verifying the connection between the IPs and the scan FF block. S4 is a step for logic synthesis of the scan FF block. S5 is a step for verifying the timing of passes where scan FFs and selectors have been inserted. S6 is a scan operation verification step.

Referencing the LSI of FIG. 12, the steps S1 to S6 will be described in more detail.

In step S1, the scan FFs 120 to 133 and the selectors 200 to 206 are designed. Normally, the scan FFs 120 to 133 and the selectors 200 to 206 are written in a RT (register transfer) level HDL (hardware descriptive language).

In step S2, the scan FFs 120 to 133, the selectors 200 to 206, the mode control circuit 110, the ROM 111, the RAM 112, the serial I/F 113, the analog circuits 114a and 114b, the CPU 115, the timer 116, the A/D conversion digital circuit 117, and the D/A conversion digital circuit 118 are connected as shown in FIG. 12.

In step S4, the RT level HDLs of the scan FFs 120 to 133 and the selectors 200 to 206 are logic synthesized and converted to a netlist.

In step S5, it is verified whether there is circuit malfunction due to line delay, which increases with the input capacity of the scan FFs 120 to 133, or signal delay, which occurs when signals pass through the selectors 200 to 206 that have been inserted.

In step S6, one chip netlist is input to an ATPG (automatic test pattern generation) tool to generate a scan pattern.

Here, scan pattern generation fails if the scan circuit has a bug, in which case the procedure returns to step S1 for designing the scan FF blocks to be inserted between the non-scan block IPs and the scan block IPs and the bug is fixed.

However, with the above conventional LSI, scan FFs and selectors must be added between the scan blocks, the CPU, the timer, the A/D conversion digital circuit, and the D/A conversion digital circuit, for example, and the non-scan blocks, the mode control circuit, the ROM, the RAM, the serial I/F, and the analog circuit, for example, during designing in order to increase the fault detection rate of the scan test. This was problematic because it lengthened the design period.

For example, the number of working days necessary for implementing the scan test with respect to the universal micro-controller LSI shown by the schematic view of FIG. 11 is as follows.

The time required for step S1 is about one day per location, so that a total of seven locations requires seven days. The time required for step S2 is about one hour per location, so that a total of seven locations requires seven hours (one day). The time required for step S3 is about one hour per location, so that a total of seven locations requires seven hours (one day). The time required for step S4 is one half day per location, so that a total of seven locations requires three and a half days. The time required for step S5 is one half day per location, so that a total of seven locations requires three and a half days. Step S6 requires one day per LSI.

Here, if there is an abnormality in the scan operation, then it is necessary to return to step S1 and redesign the LSI module. Assuming that redesigning is performed once, then the number of working days necessary to implement scan testing with respect to the universal micro-controller LSI of FIG. 11 is (7+1+1+3.5+3.5+1)×2, or in other words, 34 days.

SUMMARY OF THE INVENTION

The present invention solves the above conventional problems, and it is an object thereof to obviate the addition of scan FFs and selectors in the design for an LSI including a non-scan block and a scan block and to shorten the design time.

A semiconductor integrated circuit device of the present invention includes a non-scan block and a scan block. To achieve the above object, a first semiconductor integrated circuit device is provided with a non-scan block, which is supplied with an input signal and supplies an output signal, and a selector into which the input signal and the output signal of the non-scan block are input and which selects one of these signals as an externally output signal and outputs it. The selector is controlled such that if a scan test is performed it selects the input signal of the non-scan block and if a scan test is not performed it selects the output signal of the non-scan block.

This configuration makes it possible to control the input signal and observe the output signal of the scan block during a scan test, so that when it is used in designing an LSI it is unnecessary to add scan FFs or selectors for scan testing, and a high fault detection rate by scan testing can be achieved.

In the above configuration it is preferable that there is one or a plurality of each of the input signal, the output signal, and the externally output signal of the non-scan block and that there is an equal number of each of these three signals. Giving the signals this relationship allows the present invention to be similarly applicable when there is one of each signal and when there is a plurality of each signal.

A second semiconductor integrated circuit device of the present invention is provided with a non-scan block, which is supplied with an input signal and supplies a first and a second output signals, a scan flip-flop, a first selector into which the input signal and the first output signal of the non-scan block are input and which selects one of these signals as a first externally output signal and outputs it, and a second selector into which an output signal of the scan flip-flop and the second output signal of the non-scan block are input and which selects one of these signals as a second externally output signal and outputs it. The first selector is controlled such that if the scan test is performed it selects the input signal of the non-scan block and if the scan test is not performed it selects the first output signal of the non-scan block. The second selector is controlled such that if the scan test is performed it selects the output signal from the scan flip-flop and if the scan test is not performed it selects the second output signal of the non-scan block.

This configuration achieves the same effects as the first semiconductor integrated circuit device, even with the block for executing the non-scan test having a first output signal and a second output signal.

In the above configuration it is preferable that there is one or a plurality of each of the first input signal, the first output signal, and the first externally output signal of the non-scan block and an equal number of these three signals, and that there is one or a plurality of each of the second output signal of the non-scan block, the output signal of the scan flip-flop, and the second externally output signal of the non-scan block and an equal number of these three signals.

A third semiconductor integrated circuit device of the present invention is provided with a non-scan block, which is supplied with first and second input signals and supplies an output signal, a scan flip-flop that is input with the second input signal of the non-scan block, and a selector into which the first input signal and the output signal of the non-scan block are input, and which selects one of these signals as an externally output signal and outputs. The selector is controlled such that if the scan test is performed it selects the first input signal of the non-scan block and if the scan test is not performed it selects the output signal of the non-scan block. The scan flip-flop is controlled such that if the scan test is performed it observes the value of the second input signal of the non-scan block.

This configuration achieves the same effects as the first semiconductor integrated circuit device, even with the block for executing the non-scan test having a first input signal and a second input signal.

In the above configuration it is preferable that there is one or a plurality of each of the first input signal of the non-scan block, the output signal of the non-scan block, and the externally output signal, and an equal number of the three signals, and that there is one or a plurality of the second input signal of the non-scan block.

A fourth semiconductor integrated circuit device of the present embodiment is provided with a scan block, which is supplied with an input signal and supplies an output signal, and a selector into which an externally input signal and the output signal of the scan block are input and which selects one of these signals and inputs it to the scan block. The selector is controlled such that if the scan test is performed it selects the output signal of the scan block, and if the scan test is not performed it selects the externally input signal.

This configuration makes it possible to control the input signal and observe the output signal of the scan block during a scan test. Accordingly, when it is used in designing an LSI, there is no need to add scan FFs and selectors for scan testing, and a high fault detection rate by scan testing can be achieved.

In the above configuration it is preferable that there is one or a plurality of each of the input signal, the output signal, and the externally input signal of the scan block, and there is an equal number of the three types of signals.

A fifth semiconductor integrated circuit device of the present invention is provided with a scan block, which is supplied with an input signal and supplies first and second output signals, a scan flip-flop input with the second output signal of the scan block, and a selector into which the externally input signal and the first output signal of the scan block are input and which selects one of these signals and inputs it to the scan block. The selector is controlled such that if the scan test is performed it selects the first output signal of the scan block and if the scan test is not performed it selects the externally input signal. The scan flip-flop is controlled such that if the scan test is performed it observes the value of the second output signal of the scan block.

This configuration achieves the same effects as the fourth semiconductor integrated circuit device, even with the scan block having a first output signal and a second output signal.

In this configuration it is preferable that there is one or a plurality of each of the input signal, the first output signal, and the externally output signal of the scan block and there is an equal number of these three signals, and there is one or a plurality of the second output signal of the scan block.

A sixth semiconductor integrated circuit device of the present invention is provided with a scan block, which is supplied with an input signal and supplies an output signal, a non-scan block, which is supplied with an input signal and supplies an output signal and controlled by the scan block, and a selector into which the output signal of the scan block and the output signal of the non-scan block are input, and which selects one of these signals and inputs it to the scan block. The selector is controlled such that if the scan test is performed it selects the output signal of the scan block and if the scan test is not performed it selects the output signal of the non-scan block.

With this configuration, where there is a non-scan block controlled by the scan block and the scan flip-flop, the scan block input signal can be controlled and the scan block output signal can be observed during a scan test, so that when it is used in designing an LSI, there is no need to add scan FFs and selectors for scan testing, and a high fault detection rate by scan testing can be achieved.

In this configuration it is preferable that there is one or a plurality of each of the input signal and the output signal of the scan block and the output signal of the non-scan block and there is an equal number of these three signals, and there is one or a plurality of the input signal of the non-scan block.

According to a first method for designing a semiconductor integrated circuit device of the present invention, when designing a connection between a scan block and a non-scan block to be supplied with an input signal and supply an output signal, the method includes: arranging a selector to be controlled such that if a scan test is performed it selects the input signal of the non-scan block and if the scan test is not performed it selects the output signal of the non-scan block and outputs; and connecting the non-scan block and the scan block via the selector such that the output of the selector is an externally output signal to the scan block.

With the above design method, when designing an LSI including a non-scan block and a scan block, there are no scan FFs or selectors added between the scan block and the non-scan block, a simple design can be achieved, and the design time can be shortened.

In the above design method it is preferable that there is one or a plurality of each of the input signal, the output signal, and the externally output signal of the non-scan block and there is an equal number of the three signals.

According to a second method for designing a semiconductor integrated circuit device of the present invention, when designing a connection between a scan block and a non-scan block to be supplied with an input signal and supply first and second output signals, the method includes: arranging a scan flip-flop, a first selector to be controlled such that if the scan test is performed it selects the input signal of the non-scan block and if the scan test is not performed it selects the first output signal of the non-scan block, and a second selector to be controlled such that if the scan test is performed it selects a signal output from the scan flip-flop and if the scan test is not performed it selects the second output signal of the non-scan block; and connecting the non-scan block and the scan block via the first and the second selectors such that the output of the first selector becomes a first externally output signal to the scan block and the output of the second selector becomes a second externally output signal to the scan block.

In the above design method it is preferable that there is one or a plurality of each of the first input signal, the first output signal, and the first externally output signal of the non-scan block and there is an equal number of the three signals, and there is one or a plurality of each of the second output signal of the non-scan block, the output signal of the scan flip-flop, and the second externally output signal of the non-scan block and there is an equal number of the three signals.

According to a third method for designing a semiconductor integrated circuit device of the present invention, when designing a connection between a scan block and a non-scan block to be supplied with first and second input signals and supply an output signal, the method includes: arranging a scan flip-flop to be controlled such that if the scan test is performed it observes the value of the second input signal of the non-scan block, and a selector to be controlled such that if the scan test is performed it selects the first input signal of the non-scan block and outputs and if the scan test is not performed it selects the output signal of the non-scan block and outputs; and connecting the non-scan block and the scan block via the selector such that the output of the selector becomes an externally output signal to the scan block.

In the above design method it is preferable that there is one or a plurality of each of the first input signal of the non-scan block, the output signal of the non-scan block, and the externally output signal and there is an equal number of the three signals, and there is one or a plurality of the second input signal of the non-scan block.

According to a fourth method for designing a semiconductor integrated circuit device of the present invention, when designing a connection between a scan block to be supplied with an input signal and supply an output signal and a non-scan block, the method includes: arranging a selector to be controlled such that, when the scan test is performed, it selects the output signal of the scan block, and when the scan test is not performed, it selects the externally input signal and inputs it to the scan block; and connecting the non-scan block and the scan block via the selector such that the externally output signal of the non-scan block becomes the externally input signal to the selector.

In the above design method it is preferable that there is one or a plurality of each of the input signal, the output signal, and the externally input signal of the scan block, and there is an equal number of these three signals.

According to a fifth method for designing a semiconductor integrated circuit device of the present invention, when designing a connection between a scan block to be supplied with an input signal and supply first and second output signals and a non-scan block, the method includes: arranging a scan flip-flop to be controlled such that if the scan test is performed it observes the value of the second output signal of the scan block, and a selector to be controlled such that if the scan test is performed it selects the first output signal of the scan block and if the scan test is not performed it selects the externally input signal and inputs it to the scan block; and connecting the non-scan block and the scan block via the selector such that the externally output signal of the non-scan block becomes the externally input signal to the selector.

In the above design method it is preferable that there is one or a plurality of each of the input signal, the first output signal, and the externally output signal of the scan block and there is an equal number of the three signals, and there is one or a plurality of the second output signal of the scan block.

According to a sixth method for designing a semiconductor integrated circuit device of the present invention, when designing a connection between a scan block to be supplied with an input signal and supply an output signal and a non-scan block to be supplied with an input signal and supply an output signal and to be controlled by the scan block, the method includes: arranging a selector to be controlled such that if the scan test is performed it selects the output signal of the scan block and if the scan test is not performed it selects the output signal of the non-scan block and outputs it; and connecting the non-scan block and the scan block via the selector such that the output of the selector becomes the input signal to the scan block.

In the above design method it is preferable that there is one or a plurality of each of the input signal and the output signal of the scan block and the output signal of the non-scan block and there is an equal number of these three signals, and there is one or a plurality of the input signal of the non-scan block.

DESCRIPTION OF THE PREFERRED EMBODIMENTS

First Embodiment

Figure 1A:
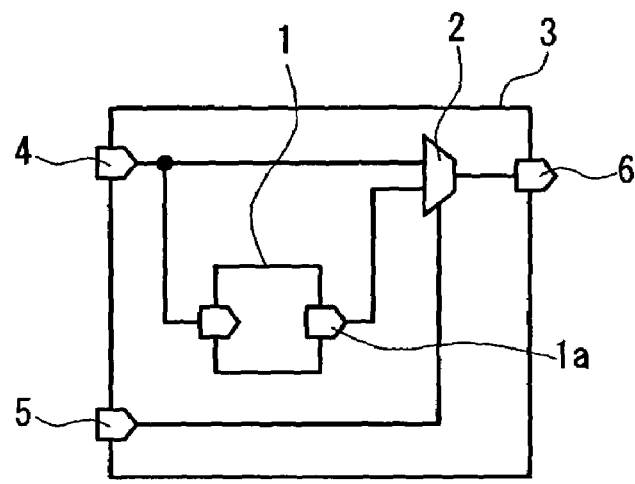
FIG. 1A is a schematic view of the non-scan block according to a first embodiment of the present invention.
Figure 1B:
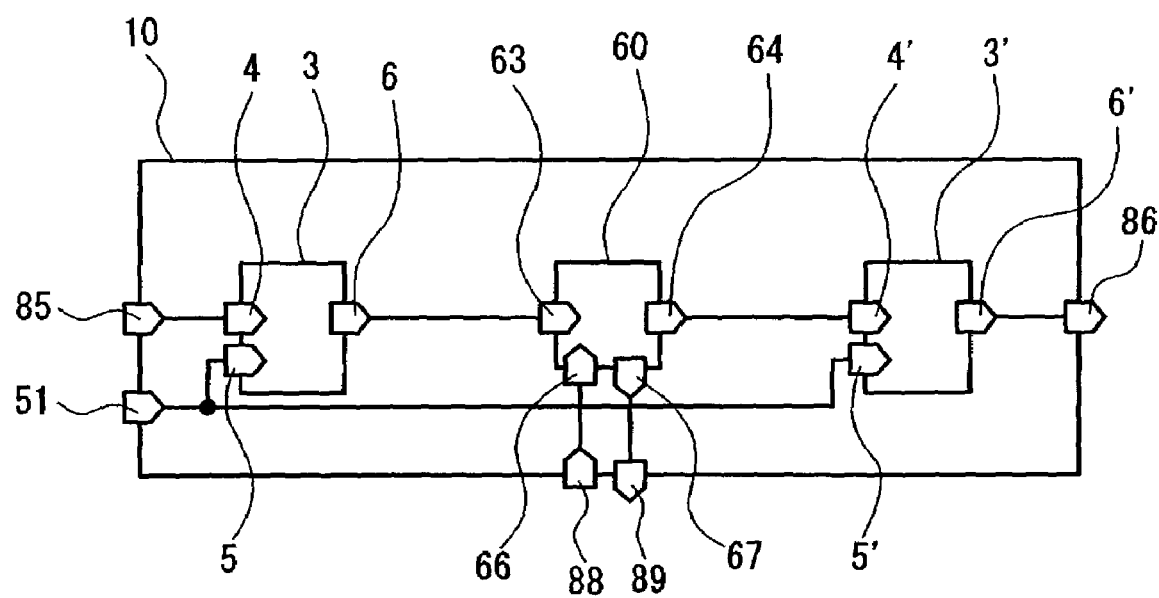
FIG. 1B is a schematic view showing an example of an LSI module adopting the non-scan block shown in FIG. 1A.

A first semiconductor integrated circuit device according to the first embodiment is an example where there is one or a plurality of each of the input signal and the output signal of the non-scan block and the externally output signal of the unit including the non-scan block and there is an equal number of the three signals. FIGS. 1A and 1B show an example where there are each one of input signal, output signal and externally output signal. When two or more of each of these signals are to be processed, a plurality of the configuration with one signal for each signal can be adopted in parallel.

FIG. 1A is a schematic view of the non-scan block of the first embodiment. In FIG. 1A, the numerals 1 and 3 denote non-scan blocks and 2 denotes a selector. Also, the numeral 4 denotes an input signal of the non-scan block 1, 1a denotes an output signal of the non-scan block 1, 5 denotes a control signal for the selector 2, and 6 denotes an output signal of the non-scan block 3. The input signal 4, the output signal 1a, and the output signal 6 are equivalent to the above-mentioned input signal, output signal, and externally output signal, respectively.

The non-scan block 3 is a unit where the selector 2 has been added to the non-scan block 1, which is the same as a conventional non-scan block. For the sake of convenience in describing a case where it is used in configuring an LSI module, in the following explanation this unit is referred to as the non-scan block. The same also applies for the description in the other embodiments.

In the non-scan block 3, the selector 2 can control the signal supplied as the output signal 6. That is, the selector 2 is switched by a control signal 5 to select either the input signal 4 or the output signal 1a as the output signal 6. When the scan test is performed, the selector 2 is switched so that it outputs the input signal 4 as the output signal 6, and when the scan test is not performed, the selector 2 is switched so that it outputs the output signal 1a as the output signal 6.

The following description illustrates how the configuration for performing fault detection in an LSI module is simplified by employing the non-scan block 3.

Figure 8A:
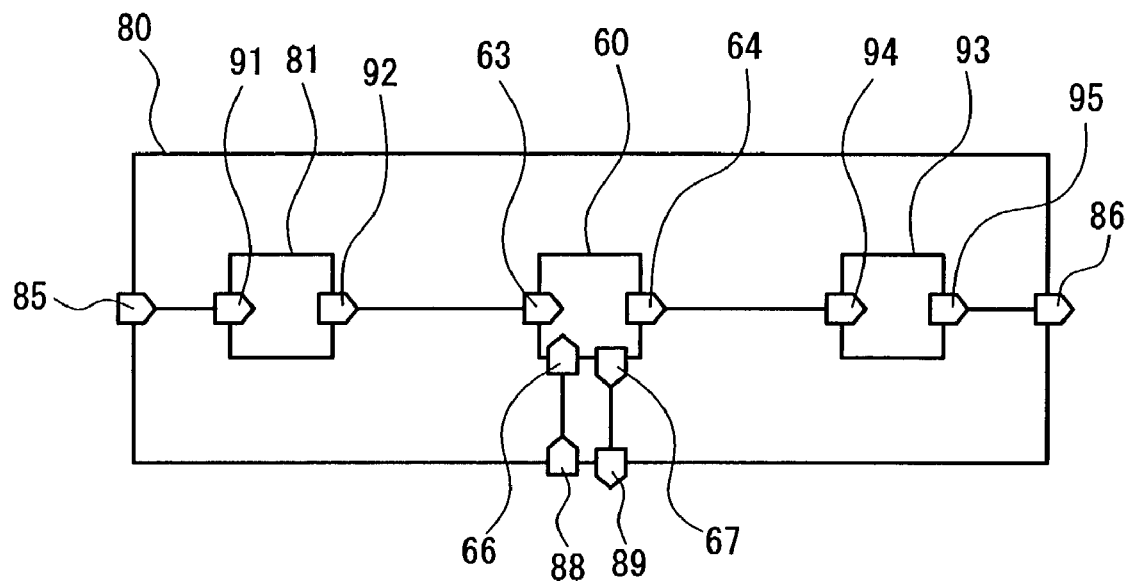
FIG. 8A is a schematic view showing a simple configuration of an LSI module adopting the scan block of FIG. 7.
Figure 8B:
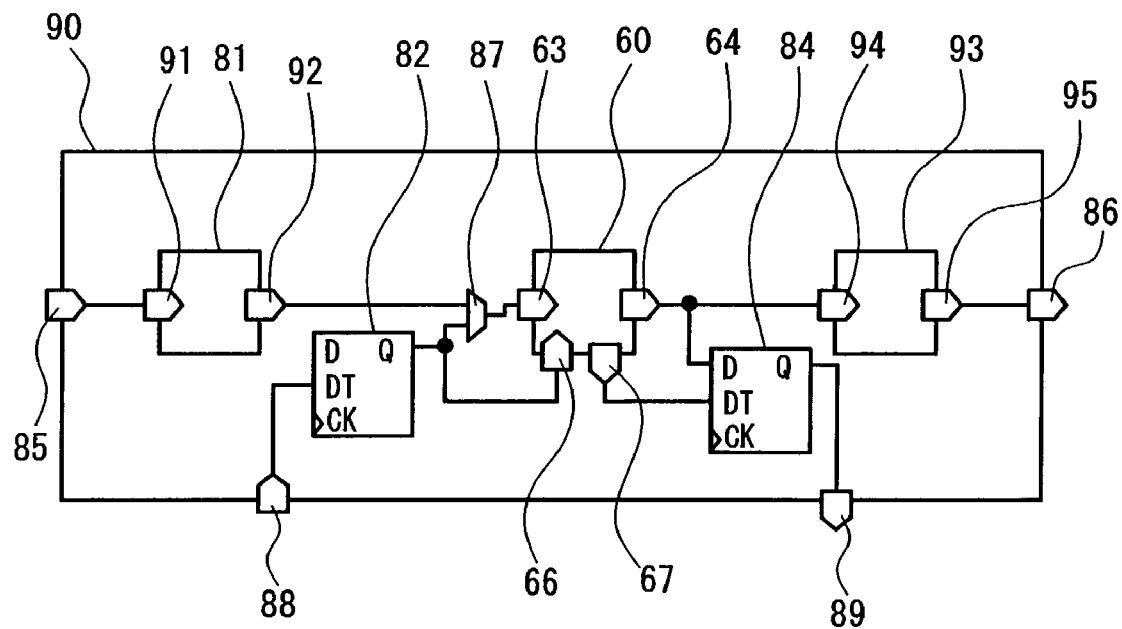
FIG. 8B is a schematic view showing the configuration of an LSI module actually used in the prior art.

In the prior art described above, an LSI module provided with non-scan blocks for the input stage and the output stage of the scan block could not be given a simple configuration like that shown in FIG. 8A. That is, as with the configuration shown in FIG. 8B, it was necessary to have the scan FF 82 and the selector 87 at the input stage and the scan FF 84 at the output stage of the scan block 60.

On the other hand, an LSI module provided with the non-scan block 3 of the present embodiment at the input stage and the output stage of the scan block can adopt a simple configuration equivalent to that in FIG. 8A. FIG. 1B shows the configuration of an LSI module 10 employing the non-scan block 3. The LSI module 10 is provided with the scan block 60 and the non-scan block 3, and a scan test method is used in diagnosing faults. The non-scan block 3 has the configuration shown in FIG. 1A. It should be noted that the explanation has been simplified by assigning the number 3 to the non-scan block provided at the input stage of the scan block 60 and the number 3' to the non-scan block provided at the output stage, however, both non-scan blocks have the same configuration. For the externally output signal of the LSI module 10, there is the input signal 85, the output signal 86, the scan shift-in signal 88, the scan shift-out signal 89, and the control signal 51 for the non-scan blocks 3 and 3'.

As detailed below, the configuration of the LSI module 10 shown in FIG. 1B permits the detection of the three types of faults A, B, and C shown in FIG. 9 through scan testing.

First, detection of the fault A is described. To detect a fault A in the scan block 60 it is necessary to be able to set any value for the input signal 63 from the outside. This is possible with the LSI module 10 because it employs the non-scan block 3 at the input stage side of the scan block 60. This is described in the following.

When performing a scan test of the LSI module 10, the control signal 51 is given from the outside to switch the selector 2 inside the non-scan block 3 in order to select the input signal 4 as the output signal 6. The input signal 4 is the input signal 85, and the input signal 85 is a signal given from the outside. Consequently, inputting a free value to the input signal 85 makes it possible to set the output signal 6 to that free value. The output signal 6 is supplied as the input signal 63 of the scan block 60, so that ultimately the value of the input signal 85 is given as the input signal 63 of the scan block 60. This means that by configuring the LSI module 10 with the non-scan block 3 employed on the input stage side of the scan block 60, the input signal 63 of the scan block 60 can be set to a free value when scan testing the LSI module 10.

To detect a fault B in the scan block 60 it is necessary to be able to observe the value of the output signal 64 from the outside. Employing the non-scan block 3' on the output stage side of the scan block 60 makes it possible to observe the value of the output signal 64 from the outside through observing the output terminal 86. This is described below.

When performing a scan test of the LSI module 10, the control signal 51 is given from the outside to switch the selector within the non-scan block 3' to select the input signal 4' as the output signal 6'. The input signal 4' is the output signal 64 of the scan block 60, and therefore the output signal 6' and the output signal 64 have the same value. The output signal 6' is output to the outside as the output signal 86, so that ultimately the value of the output signal 64 of the scan block 60 can be observed by observing the value of the output signal 86. Thus, with a simple configuration like that shown in FIG. 1B, adopting the non-scan block 3' on the output stage side of the scan block 60 makes it possible to observe the value of the output signal 64 of the scan block 60 by observing the value of the output terminal 86. Consequently, it is possible to detect a fault B of the scan block 60 without using additional scan FFs.

As mentioned in the prior art, the fault C can be detected by the scan FF 62 inside the scan block 60, regardless of whether there are scan FFs at the source supplying the input signal 63 and at the side to which the output signal 64 is supplied.

As set forth above, with the configuration of the LSI module shown in FIGS. 1A and 1B, which employs the non-scan blocks 3 and 3' of the present embodiment, it is possible to detect all faults A, B, and C that should be detected during a scan test. Moreover, this configuration obviates the need for the scan FFs 82 and 84 and the selector 87, for example, which were required by the conventional example of FIG. 8B, has a simple design, and makes it possible to shorten the design time.

Second Embodiment

Figure 2A:
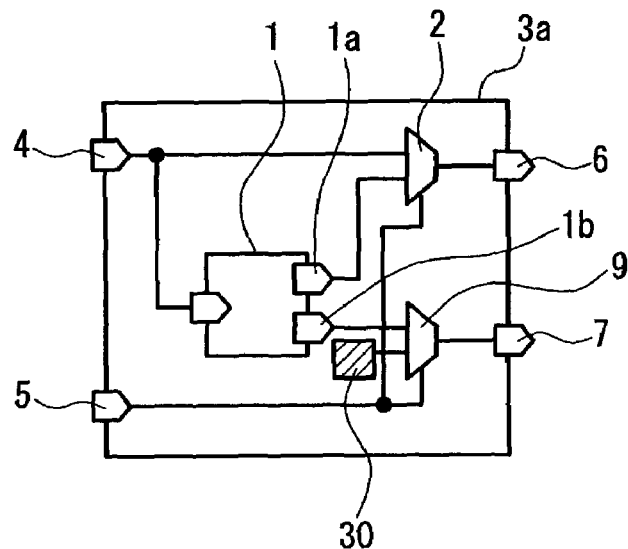
FIG. 2A is a schematic view of the non-scan block according to a second embodiment of the present invention.
Figure 2B:
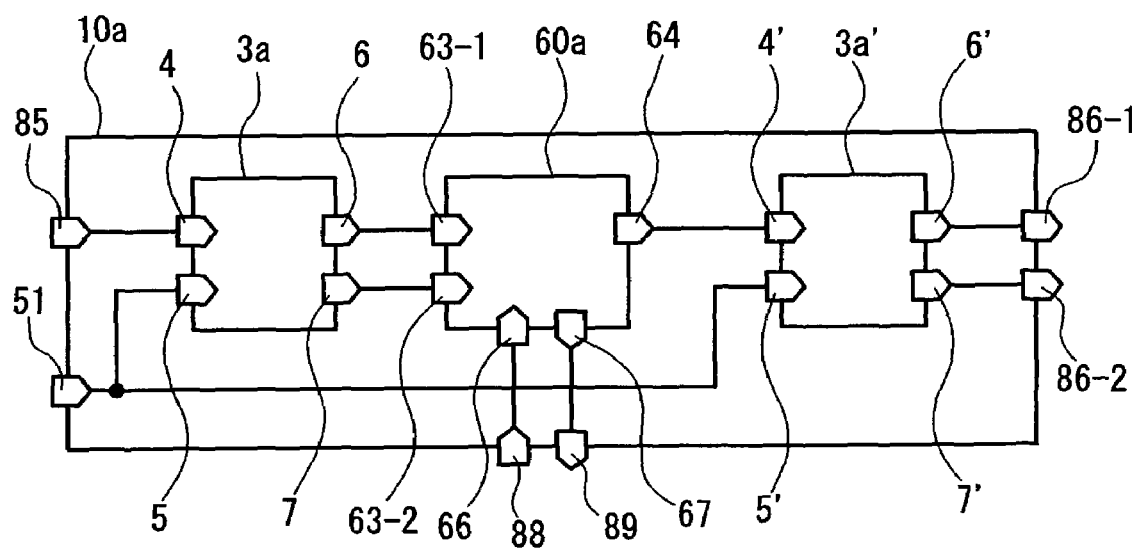
FIG. 2B is a schematic view showing an example of an LSI module adopting the non-scan block shown in FIG. 2A.

A second semiconductor integrated circuit device according to a second embodiment is an example where the non-scan block has an input signal and a first and a second output signal, and the unit including the non-scan block has a first and a second externally output signal. There is either one or a plurality of each of the input signal and the first output signal of the non-scan block and the first externally output signal and an equal number of the three signals, and there is either one or a plurality of each of the second output signal of the non-scan block, the output signal of the scan FF, and the second externally output signal and an equal number of the three signals. FIGS. 2A and 2B show an example where there is a one signal each of the input signal and the first and the second output signals of the non-scan block and the first and the second externally output signals. If two or more of these signals are to be processed, then a plurality of the configuration where there is just one signal each may be adopted in parallel.

FIG. 2A is a schematic view of the non-scan block 3a according to the second embodiment. The non-scan block 3a configuration is achieved by adding a selector 9 and a scan FF 30 to the configuration shown in FIG. 1A. Furthermore, the non-scan block 3a outputs a second output signal 7. The value of the scan FF 30 can be observed by a shift out operation. The output signals 1a and 1b of the non-scan block 1 are input to the selectors 2 and 9, respectively. In addition to the above, elements identical to those shown in FIG. 1A are given identical reference numbers. Thus, the non-scan block 3a has one input signal 4 and two output signals 1a and 1b of the non-scan block 1, and output signals 6 and 7, which are the two externally output signals.

The non-scan block 3a of FIG. 2A operates as follows. In the non-scan block 3a, the selector 2 is switched by the control signal 5 to select either the input signal 4 or the output signal 1a as the output signal 6. Additionally, the selector 9 is switched by the control signal 5 to select either the scan FF 30 output signal or the output signal 1b as the output signal 7.

When a scan test is performed, the selector 2 is switched by the control signal 5 to select the input signal 4 as the output signal 6. Additionally, the selector 9 is switched by the control signal 5 to select the scan FF 30 output signal and give the value of the scan FF 30 set by the shift in signal as the output signal 7. Thus, adopting the non-scan block 3a for the input stage of the scan block makes it possible to control the two output signals 6 and 7 when controlling output during scan testing. Furthermore, adopting the non-scan block 3a for the output stage of the scan block makes it possible to observe the input signal 4 by way of the output signal 6, and therefore observe the single input signal, when signals are observed during scan testing.

On the other hand, when the scan test is not performed, the selectors 2 and 9 are switched using the control signal 5 to select the output signals 1a and 1b of the non-scan block 1 as the output signals 6 and 7.

Next is described how adopting the non-scan block 3a simplifies the configuration for detecting faults in the LSI module.

FIG. 2B is a schematic view of an LSI module 10a provided with non-scan blocks 3a and a scan block 60a. The scan block 60a has two input signals 63-1 and 63-2 and one output signal 64. For the sake of convenience, in the following description the non-scan block 3a provided at the input stage of the scan block 60a has been given the reference numeral 3a and the one provided at the output stage of the scan block 60a has been given the reference numeral 3a'. For the externally input and output signals, the LSI module 10a has an input signal 85, output signals 86-1 and 86-2 corresponding to output signals 6' and 7' of the non-scan block 3a', a scan shift-in signal 88, a scan shift-out signal 89, and a control signal 51 for the non-scan blocks 3a and 3a'.

The configuration of the LSI module 10a shown in FIG. 2B enables detection of the three types of faults A, B, and C shown in FIG. 9 through scan testing as follows.

First, the detection of a fault A will be described. To detect a fault A in the scan block 60a, it must be possible to set a free value for the input signals 63-1 and 63-2 externally.

A free value can be set for the input signal 63-1 of the scan block 60a externally via the input signal 85 by the same operation as that for the case illustrated in the first embodiment. That is, the control signal 51 is given from the outside to switch the selector 2 inside the non-scan block 3a to select the input signal 4 as the output signal 6, so that the value of the input signal 85 can be set for the input signal 63-1 of the scan block 60a.

A free value can be set for the input signal 63-2 of the scan block 60a by the scan FF 30. That is, the control signal 51 is given from the outside to switch the selector 9 inside the non-scan block 3a to select the output signal of the scan FF 30 as the output signal 7, so that the value of the scan FF 30 can be set as the input signal 63-2 of the scan block 60a.

To detect a fault B in the scan block 60a, it must be possible to observe the value of the output signal 64 of the scan block 60a from the outside. With the LSI module 10a, the non-scan block 3a' is adopted on the output stage side of the scan block 60a, so that, with the same operation as that in the first embodiment, the value of the output signal 64 can be observed by observing the output signal 86-1.

As mentioned with respect to the prior art, a fault C can be detected by the scan FF 62 inside the scan block 60a, regardless of whether there are scan FFs at the supply source of the input signals 63-1 and 63-2 and at the destination to which the output signal 64 is supplied.

As set forth above, the configuration in FIG. 2B enables detection of the three types of faults A, B, and C. Moreover, this configuration obviates the need for the scan FFs 82 and 84 and the selector 87, for example, which are required by the conventional example of FIG. 8B, has a simple design, and makes it possible to shorten the design time.

Third Embodiment

Figure 3A:
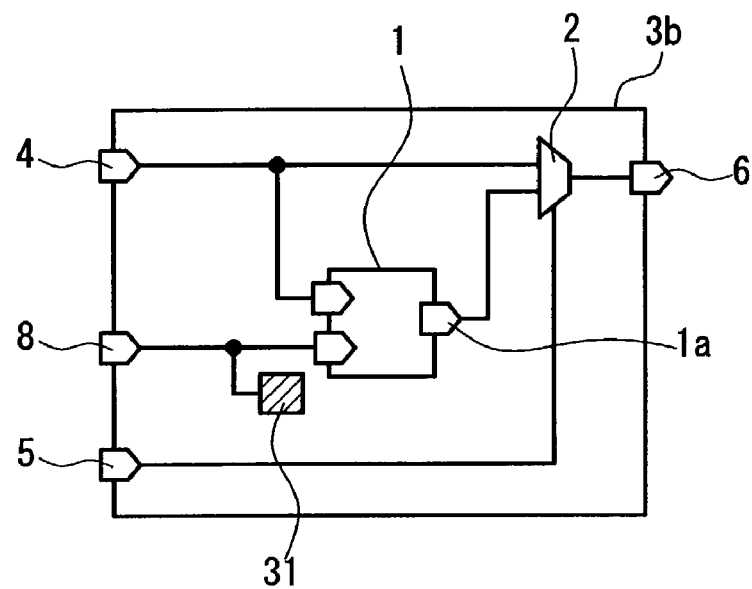
FIG. 3A is a schematic view of the non-scan block according to a third embodiment of the present invention.
Figure 3B:
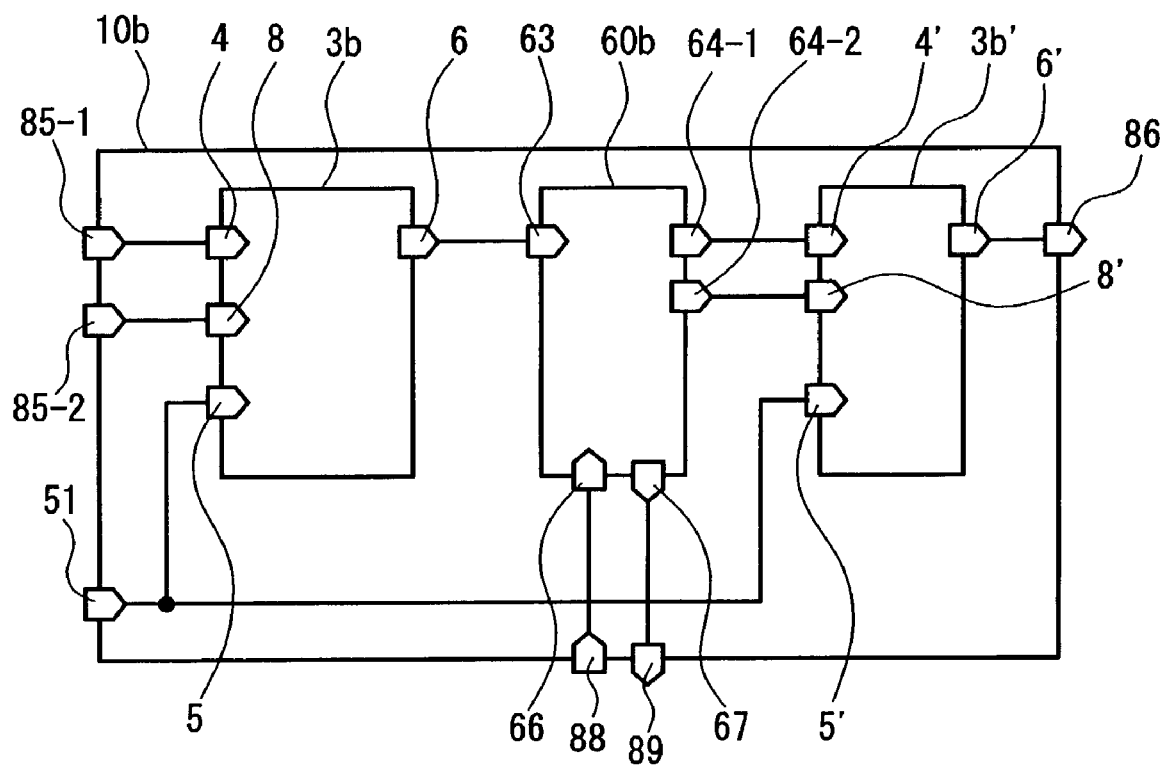
FIG. 3B is a schematic view showing an example of an LSI module adopting the non-scan block shown in FIG. 3A.

A third semiconductor integrated circuit device according to a third embodiment is an example where the non-scan block has first and second input signals and an output signal. Also, there is either one or a plurality of each of the first input signal and the output signal of the non-scan block and the externally output signal, and there is an equal number of each of these three signals. Further, there is either one or a plurality of the second input signal of the non-scan block. FIGS. 3A and 3B show an example where there is only one each of the first input signal, the second input signal, the output signal, and the externally output signal. If two or more of these signals are to be processed, then a plurality of the configuration where there is just one signal each may be adopted in parallel.

FIG. 3A is a schematic view of a non-scan block 3b according to the third embodiment. The non-scan block 3b has a configuration where the configuration shown in FIG. 1A has been provided with a scan FF 31 on the input stage of the non-scan block 1 and moreover a second input signal 8 is input. The value of the scan FF 31 can be set during scan testing by shifting in. Apart from the above, the elements in the following description similar to those shown in FIG. 1A have been given identical reference numerals. In short, in the non-scan block 3b there two input signal 4 and 8 of the non-scan block 1, an output signal 1a, and a single output signal 6 as an externally output signal.

The non-scan block 3b of FIG. 3A operates as follows. In the non-scan block 3b, the selector 2 can be switched using the control signal 5 to make it select either the input signal 4 or the output signal 1a as the output signal 6.

When a scan test is performed, the selector 2 is switched by the control signal 5 to select the input signal 4 as the output signal 6. Accordingly, by adopting the non-scan block 3b at the input stage of the scan block it is possible to control the single output signal 6 when controlling signal output during the scan test. Additionally, by adopting the non-scan block 3b at the output stage of the scan block it is possible to observe the output signal 4 by way of the output signal 6 when observing signals during the scan test. Furthermore, by capturing the value of the input signal 8 with the scan FF 31 and shifting out it is also possible to observe the input signal 8. This means that the two input signals 4 and 8 can be observed.

On the other hand, when a scan test is not performed, the selector 2 is switched by the control signal 5 to select the output signal 1a as the output signal 6.

The following explains how adopting the non-scan block 3b simplifies the configuration for fault detection in the LSI module.

FIG. 3B is a schematic view of an LSI module 10b provided with non-scan blocks 3b and a scan block 60b. The scan block 60b has one input signal 63 and two output signals 64-1 and 64-2. For the sake of convenience, in the following description the non-scan block 3b provided at the input stage of the scan block 60b has been given the reference numeral 3b and the one provided at the output stage of the scan block 60b has been given the reference numeral 3b'. For externally input and output signals, the LSI module 10b has input signals 85-1 and 85-2 corresponding to the input signals 4 and 8 of the non-scan block 3b, an output signal 86 corresponding to the output signal 6 of the non-scan block 3b', a scan shift-in signal 88, a scan shift-out signal 89, and a control signal 51 for the non-scan blocks 3b and 3b'.

The configuration of the LSI module 10b shown in FIG. 3B enables detection of the three fault types A, B, and C shown in FIG. 9 through scan testing as follows.

First, the detection of a fault A will be described. To detect a fault A in the scan block 60b, it must be possible to set a free value as the input signal 63 from the outside.

A free value can be set for the input signal 63 of the scan block 60b from the outside via the input signal 85-1 by the same operation as in the case illustrated in the first embodiment. That is, the control signal 51 is given from the outside to switch the selector 2 inside the non-scan block 3b to select the input signal 4 as the output signal 6 so that the value of the input signal 85-1 can be set for the input signal 63 of the scan block 60b.

To detect a fault B in the scan block 60b, it must be possible to observe the values of the output signals 64-1 and 64-2 from the outside. With the LSI module 10b, the non-scan block 3b' is adopted on the output stage side of the scan block 60b, so that, by the same operation as that of the first embodiment, the value of the output signal 64-1 of the scan block 60b can be observed by observing the output terminal 86. Also, by capturing the value of the input signal 8' with the scan FF 31 and shifting out to observe the input signal 8', it is possible to observe the output signal 64-2 supplied as the input signal 8'.

As mentioned regarding the prior art, a fault C can be detected by the scan FF 62 inside the scan block 60b, regardless of whether there are scan FFs at the supply source of the input signal 63 and at the side to which the output signals 64-1 and 64-2 are supplied.

As set forth above, the configuration in FIG. 3B makes it possible to detect the three types of faults A, B, and C. Moreover, this configuration obviates the need for the scan FFs 82 and 84 and the selector 87, for example, required by the conventional example of FIG. 8B, has a simple design, and makes it possible to shorten the design time.

Fourth Embodiment

Figure 4A:
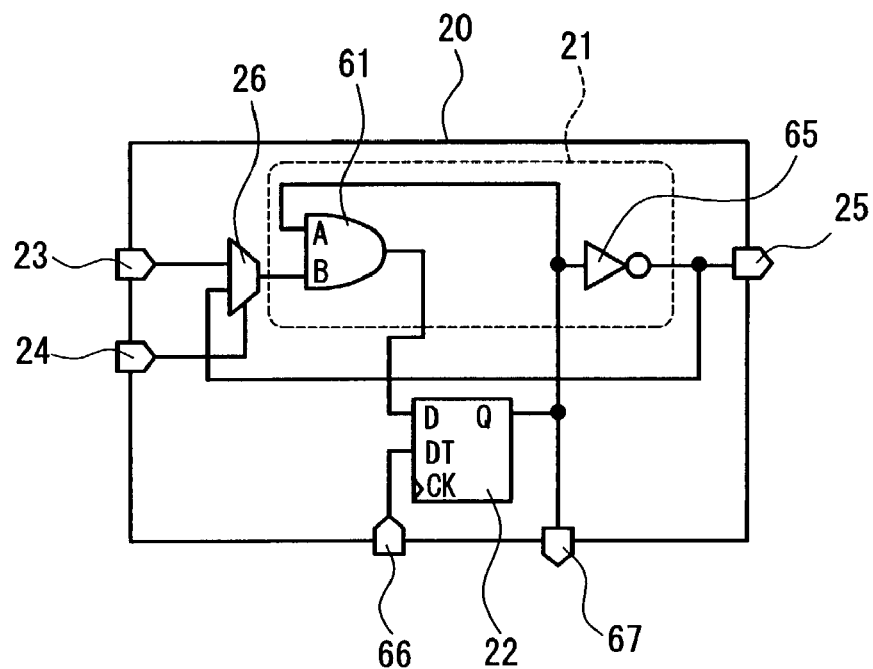
FIG. 4A is a schematic view of the scan block according to a fourth embodiment of the present invention.
Figure 4B:
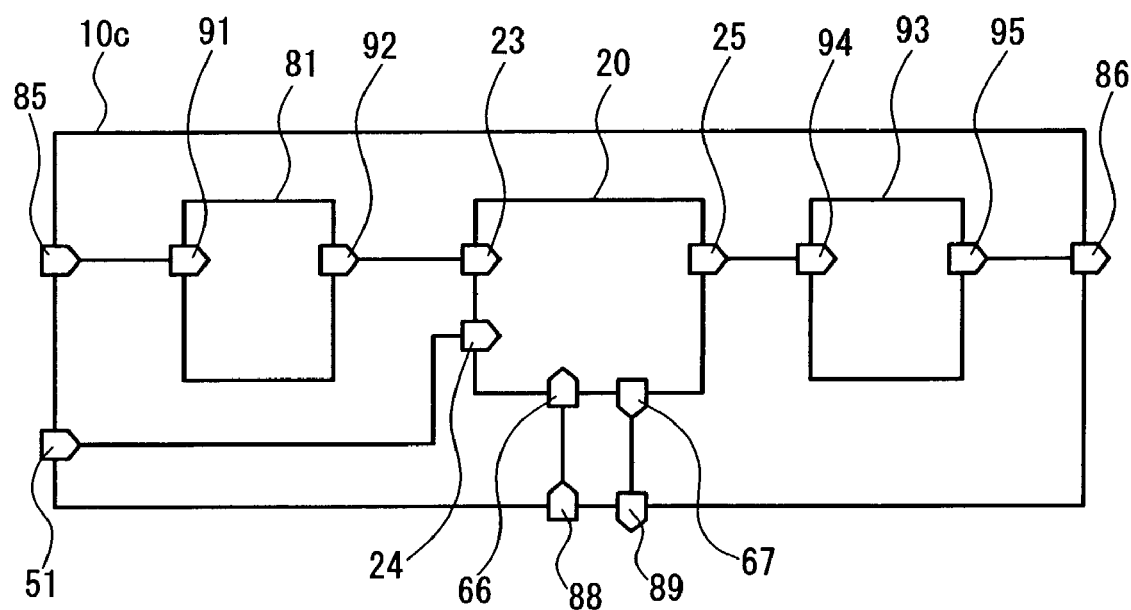
FIG. 4B is a schematic view showing an example of an LSI module adopting the scan block shown in FIG. 4A.

A fourth semiconductor integrated circuit device according to a fourth embodiment is an example including an improved scan block. In the present embodiment, there is either one or a plurality of the input signal, the output signal, and the externally input signal of the scan block, and there is an equal number of these three types of signals. FIGS. 4A and 4B show an example where there is only one input signal, output signal, and externally input signal each. If two or more of these signals are to be processed, then a plurality of the configuration where there is just one signal each may be adopted in parallel.

FIG. 4A is a schematic view of a scan block 20 according to the fourth embodiment. The scan block 20 includes a combinational circuit 21, a scan FF 22, and a selector 26. To simplify the explanation in the fourth embodiment, a case is shown where the combinational circuit 21 is made of an AND circuit 61 and a NOT circuit 65. The numeral 23 denotes an input signal, 24 denotes a control signal for the selector 26, 25 denotes an output signal, 66 denotes a scan shift-in signal, and 67 denotes a scan shift-out signal. The output signal of the selector 26 and the output signal 25 are equivalent to the input signal and the output signal, respectively, of the scan block, and the input signal 23 is equivalent to the externally input signal. The scan block 20 operates as follows.

When designing the combinational circuit 21 in advance, it is designed such that during a scan test the value of the output signal 25 can be set to a free value by an automatic scan test pattern generation tool, and defects in the output signal of the selector 26 can be detected by the scan FF 22. If during the scan test the value of the output signal 25 cannot be set to a free value by the automatic scan test pattern generation tool, then the combinational circuit 21 design is changed so that this value can be set to a free value. Also, if during the scan test defects in the output signal of the selector 26 cannot be detected by the scan FF 22, then the combinational circuit 21 design is changed so that these defects can be detected.

When carrying out a test of an LSI including the scan block 20, the combinational circuit 21 input is controlled as follows.

First, when a scan test is performed on the LSI, the selector 26 is switched by the control signal 24 to select the output signal 25 and input it to the combinational circuit 21. The value of the output signal 25 can be set to a free value by the automatic scan test pattern generation tool, and thus the scan test can be performed by inputting the automatic scan test pattern input to the combinational circuit 21.

Next, when a scan test is not performed for the LSI, the selector 26 is switched by the control signal 24 to select the input signal 23 and input it to the combinational circuit 21. That is, when the scan test is not performed, the output signal from the supply source module of the input signal 23 can be input to the combinational circuit 21.

FIG. 4B is a schematic view of an LSI module 10c provided with the scan block 20 shown in FIG. 4A and non-scan blocks 81 and 93. The numeral 85 denotes an input signal, 86 denotes an output signal, 88 denotes a shift-in signal, and 89 denotes a shift-out signal. The numerals 23, 24, and 25 denote a scan block 20 input signal, a control signal, and a scan block 20 output signal, respectively, and correspond to those shown in FIG. 4A.

The configuration of the LSI module 10c shown in FIG. 4B makes it possible to detect faults A, B, and C through scan testing as follows.

First, the detection of a fault A is executed as follows. When scan testing the LSI module 10c, the selector 26 is switched by the control signal 24 so that it selects the output signal 25 as input B of the AND circuit 61. The value of the output signal 25 is an inverse of the value of the scan FF 22, which can freely set values by shifting in. Consequently, the configuration of the LSI module 10c of FIG. 4B makes it possible to detect a fault A because the input signal of the combinational circuit 21 can be controlled freely using the scan FF 22.

Next, detection of a fault B is executed as follows. If scan testing the LSI module 10c, a "1" is shifted into the scan FF 22 to make the input A of the AND circuit 61 a "1," and the control signal 24 is manipulated so that the output signal 25 is selected as the input B of the AND circuit 61. This makes it possible to capture the output signal 25 by using the scan FF 22 and shifting out. Thus, the output signal 25 can be observed using the scan FF 22, so that a fault B can be observed.

As mentioned regarding the prior art, a fault C can be detected by the scan FF 22 inside the scan block 20, regardless of whether there are scan FFs at the supply side of the input terminal 23 and the supply destination side of the output terminal 25.

Figure 9:
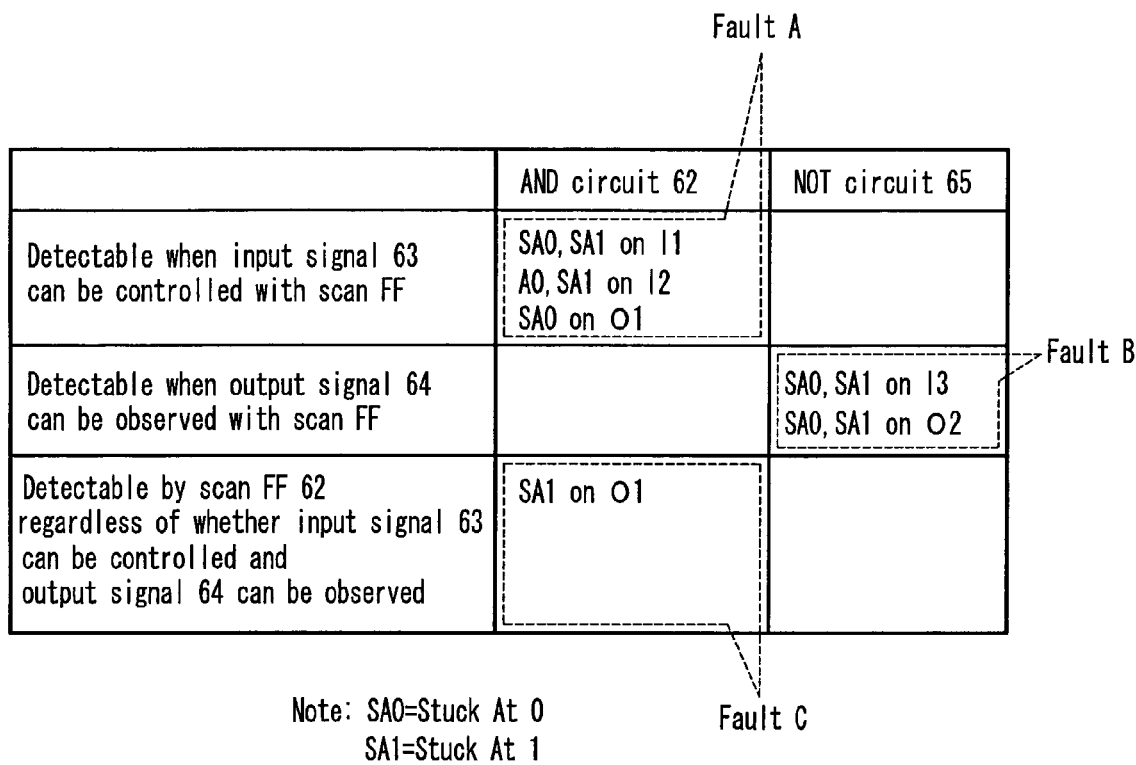
FIG. 9 shows a classification of the conditions under which stuck-at faults can be detected in the scan block of FIG. 7.

As set forth above, the configuration of an LSI module adopting the scan block of the fourth embodiment makes it possible to detect the three fault types A, B, and C shown in FIG. 9 that must be detected in a scan test. Moreover, this configuration obviates the need for the scan FFs 82 and 84 and the selector 87, for example, which were required by the conventional example in FIG. 8B, has a simple design, and makes it possible to shorten the design time.

Fifth Embodiment

Figure 5A:
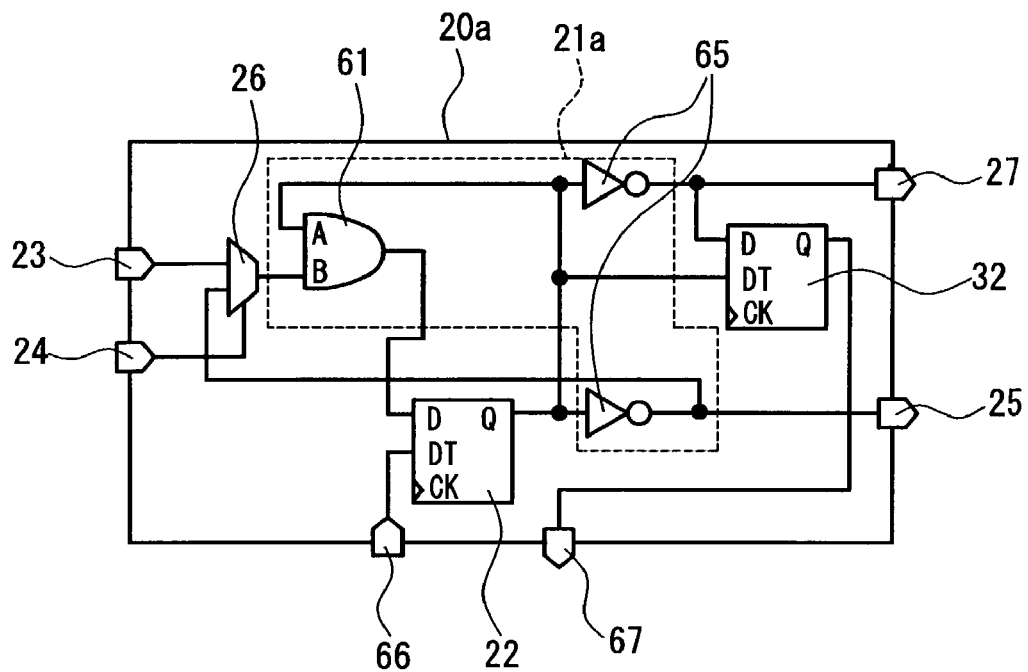
FIG. 5A is a schematic view of the scan block according to a fifth embodiment of the present invention.
Figure 5B:
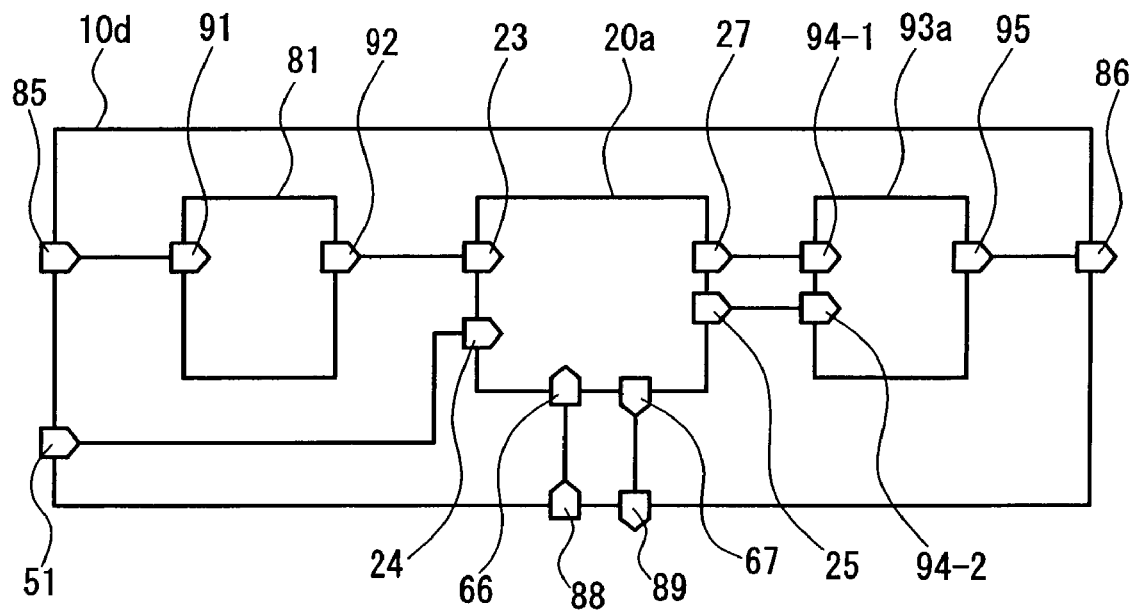
FIG. 5B is a schematic view showing an example of an LSI module adopting the scan block shown in FIG. 5A.

A fifth semiconductor integrated circuit device according to a fifth embodiment is an example where the scan block has an input signal and first and second output signals. Also, there is either one or a plurality of each of the input signal, the first output signal, and the externally output signal of the scan block, and there is an equal number of each of these three signals. Further, there is either one or a plurality of the second output signal of the scan block. FIGS. 5A and 5B show examples where there is only one input signal, first output signal, second output signal, and externally output signal each. If two or more of these signals are to be processed, then a plurality of the configuration where there is just one signal each may be adopted in parallel.

FIG. 5A is a schematic view of a scan block 20a according to the fifth embodiment. The scan block 20a includes a combinational circuit 21a, scan FFs 22 and 32, and a selector 26. To simplify the explanation in the fifth embodiment, a case is shown where the combinational circuit 21a is made of an AND circuit 61 and two NOT circuits 65. The numeral 23 denotes an input signal, 24 denotes a control signal for the selector 26, 25 and 27 denote output signals, 66 denotes a scan shift-in signal, and 67 denotes a scan shift-out signal. The scan block 20a operates as follows.

As is the case in the fourth embodiment, the combinational circuit 21a is designed such that during a scan test the value of the output signal 25 can be freely set by an automatic scan test pattern generation tool and defects in the output signal of the selector 26 can be detected by the scan FF 22.

When testing an LSI including the scan block 20a, input to the combinational circuit 21a is controlled as set forth below.

When a scan test is performed on the LSI, the control signal 24 switches the selector 26 to select the output signal 25 and input it to the combinational circuit 21a. However, since the scan block 20a has more output signals than input signals, there exists an output signal 27 that cannot be input to the selector 26. In this case the value of the output signal 27 is observed by the scan FF 32 at the time of the scan test.

When a scan test is not performed on the LSI, the control signal 24 switches the selector 26 to select the input signal 23 and input it to the combinational circuit 21a.

FIG. 5B is a schematic view of an LSI module 10d provided with the scan block 20a shown in FIG. 5A and non-scan blocks 81 and 93a. The numeral 85 denotes the input signal, 86 denotes the output signal, 88 denotes the scan shift-in signal, and 89 denotes the scan shift-out signal. The numerals 23, 25, 27, and 24 denote the scan block 20a input signal, the scan block 20a output signals, and the control signal, respectively, and correspond to their counterparts shown in FIG. 5A. The non-scan block 93a has two input signals 94-1 and 94-2 and one output signal 95.

The configuration of the LSI module 10d shown in FIG. 5B makes possible the detection of faults A, B, and C through scan testing as follows.

First, fault A is detected as follows. When a scan test of the LSI is performed, the selector 26 is switched by the control signal 24 so that it selects the output signal 25 as input B of the AND circuit 61. The value of the output signal 25 is an inverse of the value of the scan FF 22, which can set values freely by shifting in. Consequently, the configuration of the LSI module 10d of FIG. 5B makes it possible to detect a fault A because the input signal of the combinational circuit 21a can be freely controlled using the scan FF 22.

Next, detection of a fault B is executed as follows. When the LSI module 10d is scan tested, a "1" is shifted into the scan FF 22 to make the input A of the AND circuit 61 a "1," and the control signal 24 is used to select the output signal 25 as the input B of the AND circuit 61. This makes it possible to capture the output signal 25 using the scan FF 22 and shift out. Thus, the output signal 25 can be observed using the scan FF 22. Moreover, the output signal 27 can be observed using the scan FF 32. Since both the two output signals 25 and 27 can be observed, it is possible to detect a fault B.

As mentioned with regard to the prior art, a fault C can be detected by the scan FF 22 inside the scan block 20a, regardless of whether there are scan FFs at the supply source of the input terminal 23 and at the destination supplied by the output terminals 25 and 27.

As set forth above, the configuration of an LSI module adopting the scan block of the fifth embodiment makes it possible to detect the three types of faults A, B, and C shown in FIG. 9 that must be detected in a scan test. Moreover, this configuration obviates the need for the scan FFs 82 and 84 and the selector 87, for example, which were required by the conventional example in FIG. 8B, has a simple design, and makes it possible to shorten the design time.

Sixth Embodiment

Figure 6:
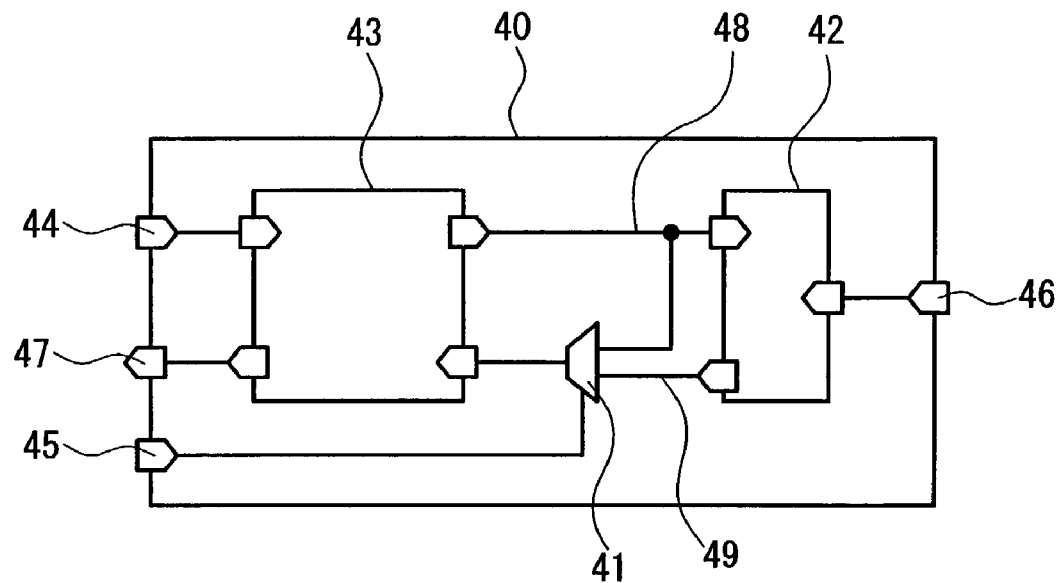
FIG. 6 is a schematic view of the A/D converter according to a sixth embodiment of the present invention.
Figure 7:
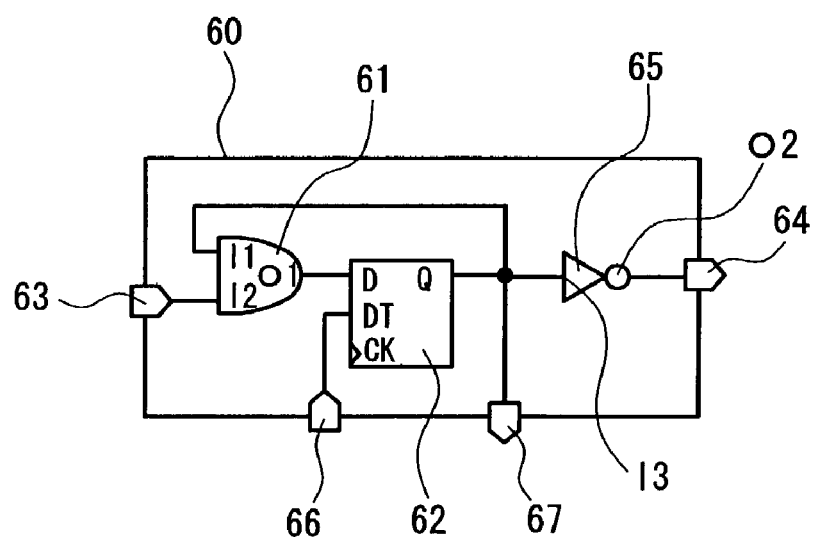
FIG. 7 is a schematic view of a conventional example of a scan block.

A sixth semiconductor integrated circuit device according to a sixth embodiment is an example of an A/D converter. The analog circuit portion thereof is a non-scan block and the digital circuit portion thereof is a scan block. For the signals exchanged between the non-scan block and the scan block, there is either one or a plurality of the input signal and output signal of the scan block and the output signal of the non-scan block and there is an equal number of each of these three signals. Also, there is either one or a plurality of the input signal to the non-scan block. FIG. 6 shows an example where there is only one each of the input signal and the output signal of the scan block and the input signal and the output signal of the non-scan block. If two or more of these signals are to be processed, then a plurality of the configuration where there is just one signal each may be adopted in parallel.

FIG. 6 is a schematic view of an A/D converter 40 according to the sixth embodiment. The A/D converter 40 includes a selector 41, an analog circuit portion 42, and a digital circuit portion 43. The numerals 44 and 46 denote input signals, 45 denotes a control signal for the selector 41, and 47 denotes an output signal. The A/D converter 40 operates as detailed below.

When designing the digital circuit portion 43 in advance, it is designed such that during a scan test the value of an internal signal 48 can be set to a free value by an automatic scan test pattern generation tool and defects in the output signal of the selector 41 can be detected by the digital circuit portion 43. If during the scan test the value of the internal signal 48 cannot be set to a free value by the automatic scan test pattern generation tool, then the digital circuit portion 43 design is changed so that this value can be set to a free value. Also, if during the scan test defects in the output signal of the selector 41 cannot be detected by the digital circuit portion 43, then the digital circuit portion 43 design is changed so that these defects can be detected.

When a scan test a performed on the A/D converter 40, the control signal 45 switches the selector 41 to select the internal signal 48, which is the output of the digital circuit portion 43, and inputs it to the digital circuit portion 43.

When a scan test is not performed, the control signal 45 switches the selector 41 to select an internal signal 49, which is the output of the analog circuit portion 42, and inputs it to the digital circuit portion 43.

As has been made evident from the preceding description of how the A/D converter 40 operates, the A/D converter 40 can detect both a fault A', which can be detected if the signal input to the digital circuit portion 43 from the analog circuit portion 42 can be controlled during the scan test, and a fault B', which can be detected if the signal output from the digital circuit portion 43 to the analog circuit portion 42 can be observed during the scan test.

Figure 10:
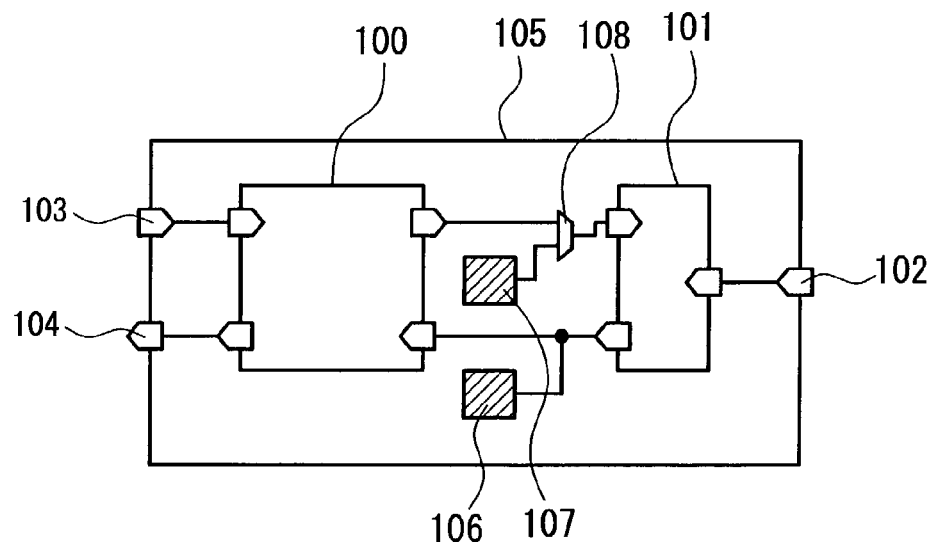
FIG. 10 is a schematic view of a conventional A/D converter.

Also, the selector 41 is the only circuit in the A/D converter 40 that has been inserted for the scan test. Therefore, in the A/D converter of FIG. 10, the scan FFs 106 and 107 and the selector 108 have been added to the circuit for scan testing, whereas in this case the scan FFs 106 and 107 can be omitted. It should be noted that if there is a greater number of internal signals 48 than internal signals 49, then a method similar to that in the fifth embodiment may be employed.

Figure 11:
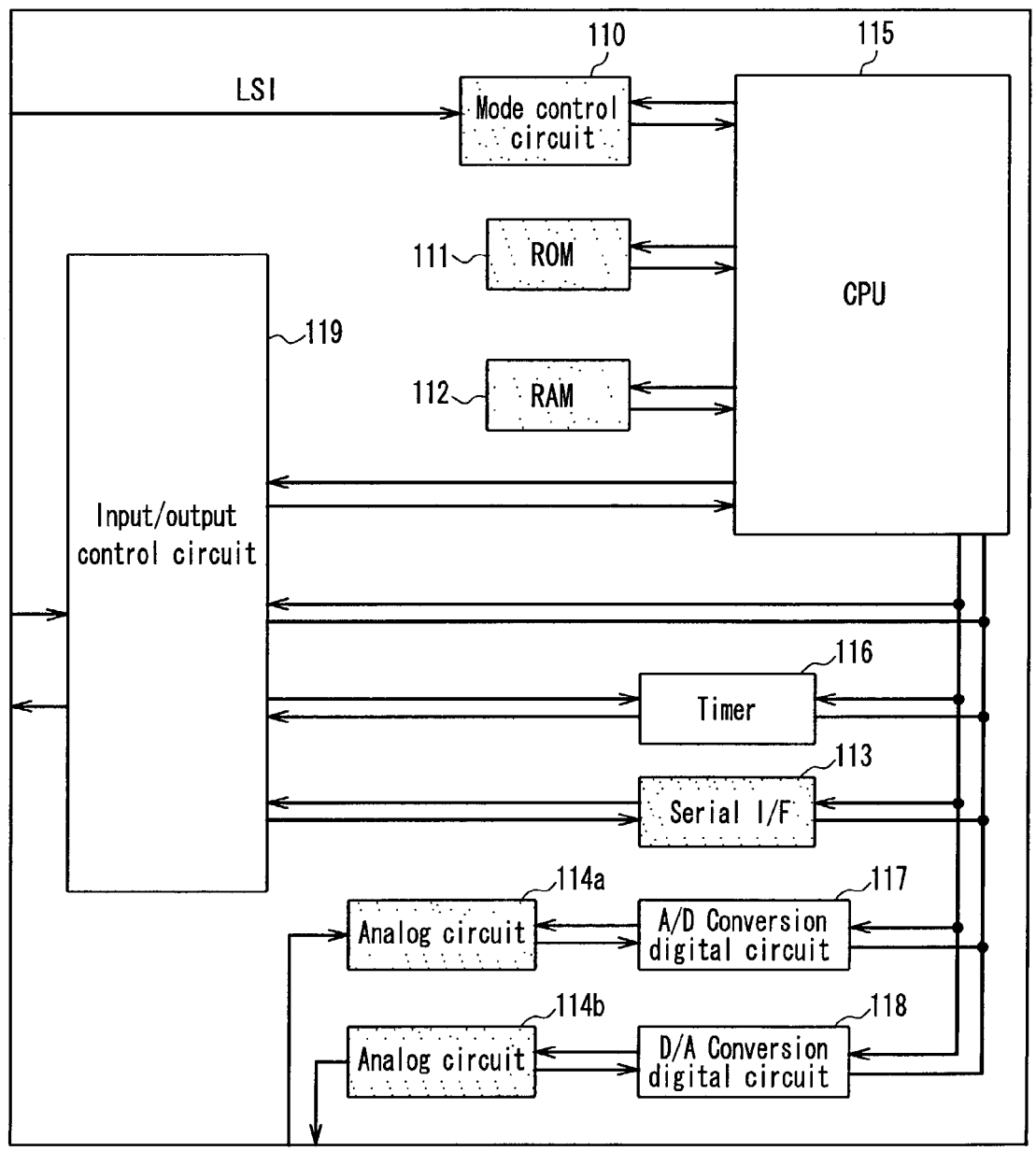
FIG. 11 is a schematic view of a conventional example of a universal micro-controller LSI.
Figure 12:
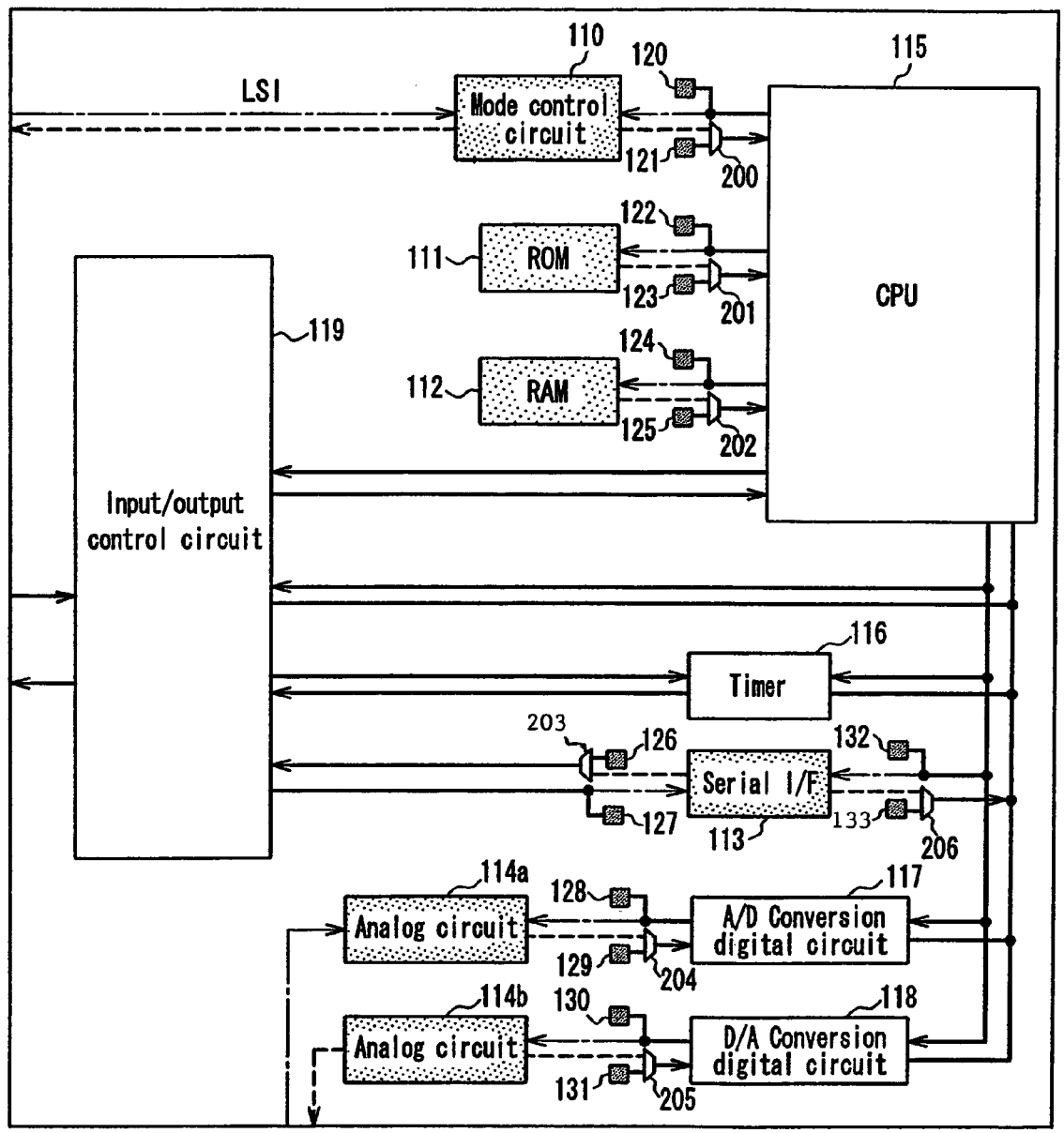
FIG. 12 is a schematic view showing a conventional universal micro-controller LSI capable of a scan test.
Figure 13:
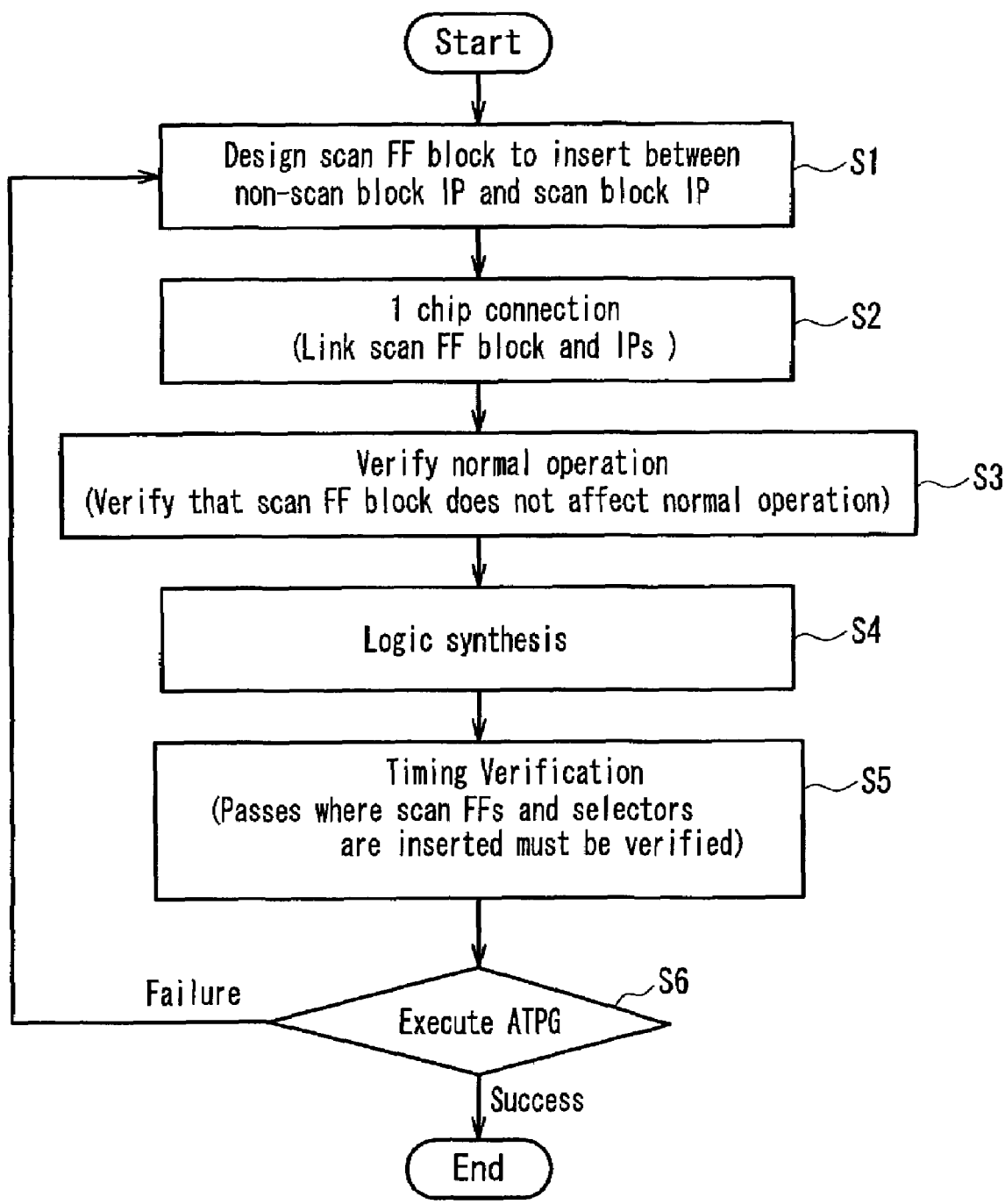
FIG. 13 is a flow chart showing the scan circuit design in the IP base design of a conventional LSI.

One illustrative example of an effect of the present invention is a reduction in the number of working days necessary for implementing a scan test when the design is that of a universal micro-controller LSI configured as shown in the schematic view of FIG. 11. More specifically, the present invention makes it possible to omit steps S1 to S5 in the scan circuit design flow shown in FIG. 13 and eliminate bugs in the scan circuit that are detected in the scan operation verification step S6. Consequently, the number of days required can be reduced from 34 days.

In the preceding embodiments, the descriptions given were for cases where there were one each, one and two, and two each, of the input signals and output signals, respectively, of the non-scan block, but the present invention is also similarly applicable when there is a plurality of input and output signals.

Also, in the above embodiments, the combinational circuits 21 and 21a were described as having an AND circuit and a NOT circuit. However, the present invention is similarly applicable when the combinational circuit 21 is embodied differently.

When there is a greater number of internal signals 48 than internal signals 49, it is possible to adopt a method similar to that for the scan block 20a according to the fifth embodiment.

The A/D converter 40 was offered as an illustrative example of a specific circuit, but the present invention also may be applied to a differently configured functional block including a non-scan block and a scan block to obtain the same effects.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor integrated circuit device including a non-scan block and a scan block, comprising:
   a first and a second combined non-scan block, where each combined non-scan block is a combination of
      said non-scan block, which is supplied with an input signal and supplies an internal non-scan output signal, and
      a selector into which the input signal and the internal non-scan output signal of the non-scan block are input, and which selects one of these signals as an externally output signal and outputs it; and
   said scan block,
   wherein the first combined non-scan block and the scan block are connected such that the externally output signal of the first combined non-scan block is input into the scan block, and an output signal of the scan block is input into the second non-scan block as the input signal, and
   wherein the selector is controlled such that when a scan test is performed it selects the input signal of the non-scan block and when a scan test is not performed it selects the internal non-scan output signal of each non-scan block.

2. The semiconductor integrated circuit device according to claim 1, wherein there is one or a plurality of each of the input signal, the internal non-scan output signal and the externally output signal of the combined non-scan block and there is an equal number of the three signals.

3. A semiconductor integrated circuit device including a non-scan block and a scan block, comprising:
   a first and a second combined non-scan block, where each combined non-scan block is a combination of
      said non-scan block, which is supplied with an input signal and supplies first and second internal non-scan output signals,
      a scan flip-flop,
      a first selector into which the input signal and the first internal non-scan output signal of the non-scan block are input, and which selects one of these signals as a first externally output signal and outputs it, and
      a second selector into which an output signal of the scan flip-flop and the second internal non-scan output signal of the non-scan block are input and which selects one of these signals as a second externally output signal and outputs it; and
   said scan block,
   wherein the first combined non-scan block and the scan block are connected such that the first and second externally output signals of the first combined non-scan block are input into the scan block, and an output signal of the scan block is input into the second non-scan block as the input signal,
   wherein the first selector is controlled such that when the scan test is performed it selects the input signal of the non-scan block and when the scan test is not performed it selects the first internal non-scan output signal of each non-scan block; and
   wherein the second selector is controlled such that when the scan test is performed it selects the output signal from the scan flip-flop and when the scan test is not performed it selects the second internal non-scan output signal of each non-scan block.

4. The semiconductor integrated circuit device according to claim 3, wherein there is one or a plurality of each of the first input signal, the first internal non-scan output signal, and the first externally output signal of the non-scan block and there is an equal number of the three signals, and there is one or a plurality of each of the second internal non-scan output signal of the non-scan block, the output signal of the scan flip-flop, and the second externally output signal of the non-scan block and there is an equal number of the three signals.

5. A semiconductor integrated circuit device including a non-scan block and a scan block, comprising:
   a first and a second combined non-scan block, where each combined non-scan block is a combination of
      said non-scan block, which is supplied with first and second input signals and supplies an internal non-scan output signal,
      a scan flip-flop into which the second input signal of the non-scan block is input, and
      a selector into which the first input signal and the internal non-scan output signal of the non-scan block are input and which selects one of these signals as an externally output signal and outputs it; and
   said scan block,
   wherein the first combined non-scan block and the scan are connected such that the externally output signal of the first combined non-scan block is input into the scan block, and a first and second output signal of the scan block is input into the second non-scan block as the first and second internal input signals,
   wherein the selector is controlled such that when the scan test is performed it selects the first input signal of the non-scan block and when the scan test is not performed it selects the internal non-scan output signal of each non-scan block; and
   wherein the scan flip-flop is controlled such that when the scan test is performed it observes the value of the second input signal of each non-scan block.

6. The semiconductor integrated circuit device according to claim 5, wherein there is one or a plurality of each of the first input signal of the non-scan block, the internal non-scan output signal of the non-scan block, and the externally output signal and there is an equal number of the three signals, and there is one or a plurality of the second input signal of the non-scan block.

7. A semiconductor integrated circuit device, comprising:
a scan block, which is supplied with an internal input signal and supplies an internal output signal;
a non-scan block, which is supplied with an externally input signal and the internal output signal of the scan block as an internal input signal and supplies an internal output signal;
a selector into which the internal output signal of the scan block and the internal output signal of the non-scan block are input, and which selects one of these signals and inputs it to the scan block as the internal input signal;
wherein the selector is controlled such that when a scan test is performed it selects the internal output signal of the scan block and when the scan test is not performed it selects the internal output signal of the non-scan block.

8. The semiconductor integrated circuit device according to claim 7, wherein there is one or a plurality of each of the input signal and the internal output signal of the scan block and the internal output signal of the non-scan block and there is an equal number of these three signals, and there is one or a plurality of the input signal of the non-scan block.

9. A method for designing a semiconductor integrated circuit device, which includes designing a connection between a scan block and a non-scan block to be supplied with an input signal and supply an output signal, the method comprising:
arranging a selector to be controlled such that, when a scan test is performed, it selects the input signal of the non-scan block, and when the scan test is not performed, it selects the internal non-scan output signal of the non-scan block, and outputs it;
connecting a first non-scan block and the scan block via a first selector such that the externally output signal of the selector is an input to the scan block; and
connecting a second non-scan block and the scan block via a second selector such that an output signal of the scan block is an input to the second non-scan block.

10. The method for designing a semiconductor integrated circuit device according to claim 9, wherein there is one or a plurality of each of the input signals, the internal non-scan output signals, and the externally output signals of the non-scan block and there is an equal number of the three signals.

11. A method for designing a semiconductor integrated circuit device, which includes designing a connection between a scan block and a non-scan block to be supplied with an input signal and supply an output signal, the method comprising:
arranging a scan flip-flop,
a first selector to be controlled such that, when the scan test is performed, it selects the input signal of the non-scan block, and when the scan test is not performed, it selects the first output signal of the non-scan block, and
a second selector to be controlled such that, when the scan test is performed, it selects a signal output from the scan flip-flop, and when the scan test is not performed, it selects the second output signal of the non-scan block;
connecting a first non-scan block and the scan block via a first and a second selector such that the output of the first selector becomes a first externally output signal to the scan block and the output of the second selector becomes a second externally output signal to the scan block; and
connecting a second non-scan block and the scan block via a third selector such that an output signal of the scan block is an input to the second non-scan block.

12. The method for designing a semiconductor integrated circuit device according to claim 11, wherein there is one or a plurality of each of the first input signal, the first output signal, and the first externally output signal of the non-scan block and there is an equal number of the three signals, and there is one or a plurality of each of the second output signal of the non-scan block, the output signal of the scan flip-flop, and the second externally output signal of the non-scan block and there is an equal number of the three signals.

13. A method for designing a semiconductor integrated circuit device, which includes designing a connection between a scan block and a non-scan block to be supplied with an input signal and supply an output signal, the method comprising:
arranging a scan flip-flop to be controlled such that, when the scan test is performed, it observes the value of a second input signal of the non-scan block, and
a selector to be controlled such that, when the scan test is performed, it selects a first input signal of the non-scan block and outputs, and when the scan test is not performed, it selects the internal non-scan output signal of the non-scan block and outputs;
connecting a first non-scan block and the scan block via the selector such that the output of the selector becomes an externally input signal to the scan block; and
connecting a second non-scan block and the scan block via a second selector such that a first and a second output signal of the scan block are input to the second non-scan block.

14. The method for designing a semiconductor integrated circuit device according to claim 13, wherein there is one or a plurality of each of the first input signal of the non-scan block, the internal non-scan output signal of the non-scan block, and the externally output signal and there is an equal number of the three signals, and there is one or a plurality of the second input signal of the non-scan block.

15. A method for designing a semiconductor integrated circuit device, which includes designing a connection between a scan block to be supplied with an internal input signal and supply an internal output signal, and a non-scan block to be supplied with an externally input signal and an internal input signal and supply an internal output signal, the method comprising:
connecting the non-scan block and the scan block such that the internal output signal of the scan block becomes the internal input signal to the non-scan block;
arranging a selector to be controlled such that, when the scan test is performed, it selects the internal output signal of the scan block, and when the scan test is not performed, it selects the internal output signal of the non-scan block, and outputs the selected signal; and
connecting the non-scan block and the scan block via the selector such that the output signal of the selector becomes the internal input signal to the scan black.

16. The method for designing a semiconductor integrated circuit device according to claim 15, wherein there is one or a plurality of each of the input signal and the internal output signal of the scan block and the internal output signal of the non-scan block and there is an equal number of these three signals, and there is one or a plurality of the input signal of the non-scan block.

* * * * *